United States Patent [19]

Shekhawat et al.

[11] Patent Number: 4,947,055
[45] Date of Patent: Aug. 7, 1990

[54] BASE DRIVE CIRCUIT FOR DARLINGTON-CONNECTED TRANSISTORS

[75] Inventors: Sampat S. Shekhawat; P. John Dhyanchand, both of Rockford, Ill.

[73] Assignee: Sundstrand Corporation, Rockford, Ill.

[21] Appl. No.: 296,676

[22] Filed: Jan. 13, 1989

[51] Int. Cl.[5] .................. H03K 17/04; H03K 17/60
[52] U.S. Cl. ................................ 307/254; 307/263; 307/270; 307/300; 307/315
[58] Field of Search ............... 307/270, 254, 300, 315, 307/263

[56] References Cited

U.S. PATENT DOCUMENTS

| | | |
|---|---|---|
| 3,571,624 | 3/1971 | Leung ............................... 307/300 |
| 3,697,783 | 10/1972 | Seager . |
| 3,971,961 | 7/1976 | Inami et al. . |
| 4,132,906 | 1/1979 | Allen . |
| 4,210,826 | 7/1980 | Baker . |
| 4,234,805 | 11/1980 | Carlsen . |
| 4,239,988 | 12/1980 | Akamatsu . |
| 4,259,939 | 4/1981 | Coates . |
| 4,312,029 | 1/1982 | Zellmer . |
| 4,318,011 | 3/1982 | Zeis . |
| 4,404,478 | 9/1983 | Rischmüller . |
| 4,410,810 | 10/1983 | Christen . |
| 4,616,144 | 10/1986 | Hideshima et al. . |
| 4,636,713 | 1/1987 | Stefani . |
| 4,654,544 | 3/1987 | Wheeler . |
| 4,725,741 | 2/1988 | Shekhawat et al. . |
| 4,728,817 | 3/1988 | Jessee et al. . |

OTHER PUBLICATIONS

"High-Voltage High-Frequency Power-Switching Transistor Module with Switching-Aid-Circuit Energy Recovery" by B. W. Williams, appearing at 8049 IEE Proceedings, Sections A & I, vol. 131, (1984), Jan. No. 1, Part B, Old Working, Surrey, Great-Britain.

Primary Examiner—John Zazworsky
Attorney, Agent, or Firm—Marshall, O'Toole, Gerstein, Murray & Bicknell

[57] ABSTRACT

Prior base drive circuits for Darlington-connected transistors have accomplished a significant increase in the rate at which such transistors can be turned off and on. However, such circuits have utilized relatively numerous circuit elements or components to accomplish this result. In order to overcome this problem, a drive circuit 26 for rapidly switching driver and driven transistors Q3, Q4 connected in a Darlington configuration includes a first controllable switch Q1 coupled to a control electrode of the driver transistor Q3, an inductor L1 coupled to the first controllable switch Q1 and the control electrode of the driver transistor Q3 and a second controllable switch Q2 coupled to the control electrode of at least one of the transistors. A driving stage 32 is coupled to the controllable switches and closes same at the beginning of a turn on sequence to establish current flow through the inductor. The driving stage subsequently opens the second controllable switch while maintaining the first switch closed so that the current flow through the inductor is provided to the driver transistor to turn on same. The drive circuit utilizes fewer circuit components than prior drive circuits.

11 Claims, 5 Drawing Sheets

BASE DRIVE CIRCUIT FOR DARLINGTON-CONNECTED TRANSISTORS

DESCRIPTION

1. Technical Field

The present invention relates generally to switching circuits, and more particularly to a drive circuit for rapidly switching transistors connected in a Darlington configuration.

2. BACKGROUND ART

There are numerous applications in which it is necessary to rapidly turn on and off high-current-capacity power switches to control the power delivered to a load. For example, in an inverter operated in a pulse width modulated (PWM) mode of operation, it may be necessary to cycle power switches carrying a high magnitude of current at a 30 kilohertz switching frequency. Typically, these power switches comprise Darlington-connected bipolar power transistors. At present, the specified storage time of these transistors is on the order of 5 to 7 microseconds. This storage time adversely affects the maximum switching frequency for these transistors and may render them unsuitable for certain applications.

Prior attempts at reducing the turn-off time of Darlington power switches have relied upon the application of a reverse bias to the base-emitter junction of one or both transistors at the time of turn-off to rapidly deplete excess carriers therein. For example, Seager U.S. Pat. No. 3,697,783 discloses transistor switching circuitry that includes a first gating circuit coupled to the base of an input transistor and a second gating circuit coupled to the base of an output transistor. The output transistor is driven on in response to a gating signal by the input transistor and the second gating circuit During the time the transistors are on, a voltage is built up on a capacitor coupled between the second gating circuit and the base of the output transistor When the gating signal changes state, a switch is closed to couple the capacitor between the base and emitter electrodes of the output transistor to deplete the number of excess carriers therein so that turn-off can occur in rapid fashion.

Jessee et al. U.S. Pat. No. 4,728,817 discloses a driver circuit for Darlington-connected transistors including a capacitor coupled to the base of the output transistor which hastens turn off of the transistors.

Coates U.S. Pat. No. 4,259,939 discloses a control circuit for controlling the rate of turn off of Darlington-connected transistors The circuit includes a pair of zener diodes connected in series, a capacitor coupled in parallel with the zener diodes and a resistor coupled in series with the parallel combination of the zener diodes and the capacitor.

Other types of circuits for decreasing the turnoff time of a power switch are disclosed in Stefani U.S. Pat. No. 4,636,713, Wheeler U.S. Pat. No. 4,654,544, Akamatsu U.S. Pat. No. 4,239,988, Inami et al U.S. Pat. No. 3,971,961, Carlsen II U.S. Pat. No. 4,234,805 and Baker U.S. Pat. No. 4,210,826 (see FIG. 7 and column 14, line 51 through column 15, line 53).

Prior types of circuits for decreasing the turn-off time of power switches have serious limitations. In the case of circuits like Seager, discussed above, localized "hot spots" or secondary breakdown effects can arise in the base-collector junctions of the transistors due to the rapid depletion of excess carriers. These "hot spots" not only reduce the efficiency of the transistor but also increase the chances of failure thereof. Also, these prior circuits have not achieved the required switching speeds and have not reduced switching losses to an acceptable degree.

Drive circuits for Darlington-connected transistors which overcome the foregoing problem are disclosed in Shekhawat et al. U.S. Pat. No. 4,725,741, and in Shekhawat et al., U.S. application Ser. No. 07/136,139, filed Dec. 21, 1987, entitled "Drive Circuit for Fast Switching of Darlington Connected Transistors", both assigned to the assignee of the present application and the disclosures of which are hereby incorporated by reference. These drive circuits accomplish rapid switching of driver and driven transistors connected together in a Darlington configuration. Each circuit includes a first power source which develops voltage of a first polarity, a turn-on gating network coupled to the base electrode of the driver transistor for selectively applying the first polarity voltage to first and second turn-off capacitors coupled between the turn-on gating network and the base of the driver and driven transistors, respectively, a second power source that develops voltage of a second polarity opposite the first polarity and a turn-off gating network for selectively coupling the second power source to the turn-off capacitors. During the time the first power source is coupled to the turn-off capacitors, the transistors are turned on and a charge is stored by the capacitors. When the second power source is coupled to the capacitors, an augmented voltage of the second polarity greater than the voltage developed by the second power source is applied to the base of the driver and driven transistors to rapidly turn off same. Circuitry in the form of RC networks are included for providing a dwell interval between application of the first polarity voltage and application of the second polarity voltage to the transistors during which neither voltage is applied thereto. During this dwell interval, recombination of excess carriers in the transistors occurs so that the incidence of localized "hot spots" in the base-collector junction of the transistors is reduced when the second polarity voltage is subsequently applied to the transistors.

While the circuits disclosed in the Shekhawat et al. patent and application are effective to rapidly switch Darlington-connected transistors, it would be advantageous to reduce the number of components used in such circuits.

DISCLOSURE OF INVENTION

In accordance with the present invention, a drive circuit for use with Darlington-connected transistors which accomplishes rapid and efficient switching of such transistors while minimizing the occurrence of "hot spots" utilizes fewer circuit components than the circuits disclosed in the Shekhawat et al. patent and application noted above.

More particularly, a drive circuit for rapidly switching driver and driven transistors connected in a Darlington configuration includes a first controllable switch coupled to a control electrode of the driver transistor and operable to selectively apply a first polarity voltage to the transistors to turn on same, an inductor coupled to the first controllable switch and the control electrode of the driver transistor and a second controllable switch coupled to the control electrode of at least one of the transistors and operable to selectively apply a second polarity voltage to the transistors to turn off same. Means are coupled to the controllable switches for closing same at the beginning of a turn on sequence to establish current flow through the inductor and means are operative following the beginning of the turn on sequence for opening the second controllable switch while maintaining the first switch closed so that the current flow through the inductor is provided to the driver transistor to turn on same.

In addition to the foregoing, means are provided for opening the first controllable switch and closing the second controllable switch at the beginning of a turn off sequence so that control electrode currents are drawn from the transistors to turn off same. Inductors may be provided in current paths from the control electrodes of the transistors to delay the drawing of current therefrom until after delay periods have elapsed so that recombination of excess carriers can occur to in turn minimize the incidence of "hot spots" in the transistors.

Capacitors may also be coupled to the control electrodes of the transistors which are charged by the currents provided after the beginning of the turn on sequence. The charged capacitors subsequently cause an augmented negative voltage to be applied to the transistors during the turn off sequence so that turn off is accomplished rapidly.

The drive circuit of the present invention is capable of reducing the turn-off time of Darlington-connected bipolar transistors to less than three microseconds so that such transistors can be used in high power, high switching frequency applications.

The drive circuit also reduces power losses and provides greater immunity to shoot-through.

BEST MODE FOR CARRYING OUT THE INVENTION

Figure 1:
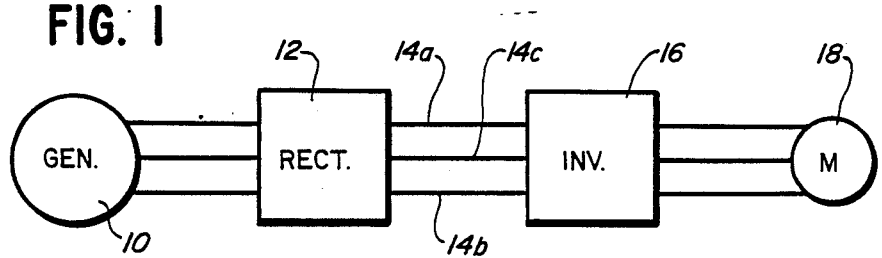
FIG. 1 is a block diagram illustrating a motor drive circuit with which the present invention may be used.

Referring now to FIG. 1, there is illustrated a motor drive with which the present invention may be used. The motor drive comprises a generator 10 which is driven by a variable speed source of motive power (not shown). The generator 10 develops polyphase AC power which is coupled to a rectifier circuit 12 that converts the AC power into positive, negative and ground voltages on DC power buses 14a,14b,14c, respectively. The power buses 14 are in turn coupled to an inverter 16 which converts the DC power into constant or variable frequency polyphase AC power which is delivered to a motor 18.

It should be noted that the motor drive shown in FIG. 1 is exemplary only, in the sense that the present invention may be used with other types of circuits requiring high power and fast switching capability.

Figure 2:
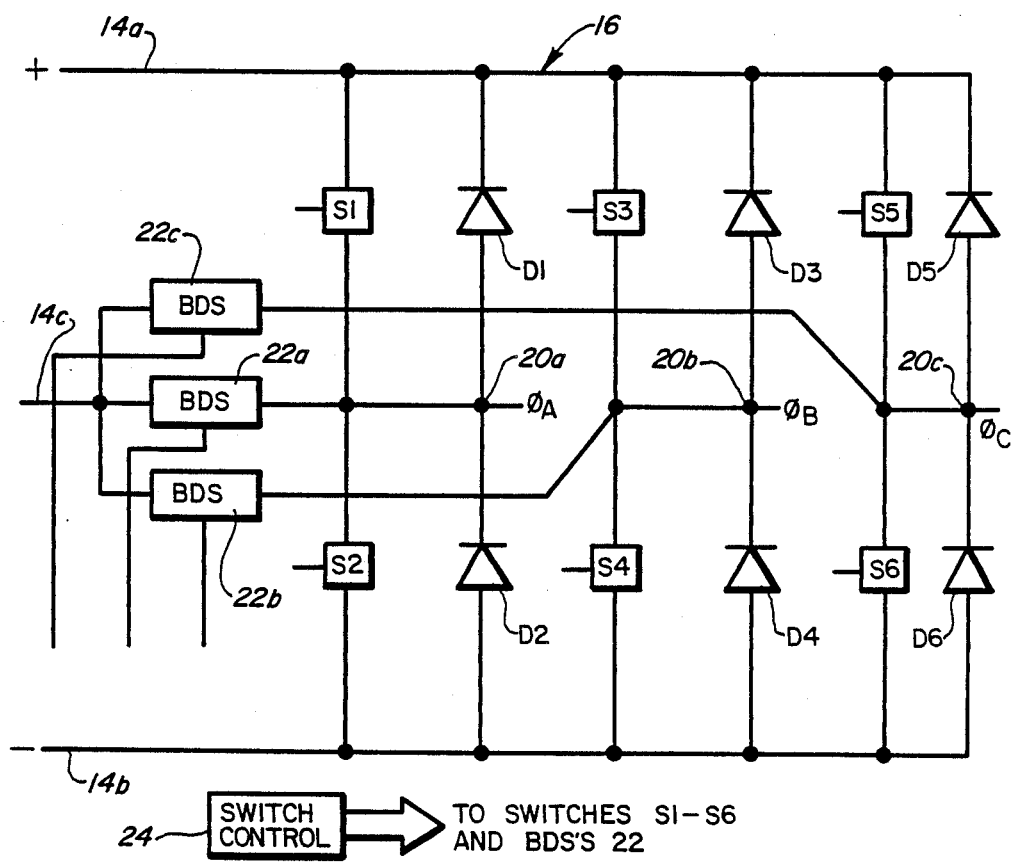
FIG. 2 is a combined block and schematic diagram of the inverter shown in FIG. 1.

Referring now to FIG. 2, the inverter 16 includes first through sixth power switches S1-S6 which are coupled in a three phase bridge configuration. Anti-parallel diodes D1-D6 are coupled across the switches S1-S6, as is conventional.

The inverter 16 shown in FIG. 2 is intended for use as a neutral-clamped pulse width modulated (PWM) inverter in which the maximum output voltage swing developed at phase outputs 20A,20B,20C is limited to one-half the voltage across the DC power buses 14a,14b. Such an inverter is disclosed in Glennon U.S. Pat. No. 4,564,895, entitled "Neutrally Clamped PWM Inverter" and the disclosure of which is hereby incorporated by reference.

It should be noted that the instant invention may be used in other switching circuits, such as choppers, circuits using proportional base drive circuits or any other circuits using transistors connected in a Darlington configuration.

The inverter 16 shown in FIG. 2 includes three bidirectional switches 22a,22b,22c which are coupled between the phase outputs 20A-20C, respectively, and the power bus 14c. The switches S1-S6 and the bidirectional switches 22 are in turn operated by a switch control 24 to cause generation of the appropriate AC waveform for operating the motor 18.

Figure 3:
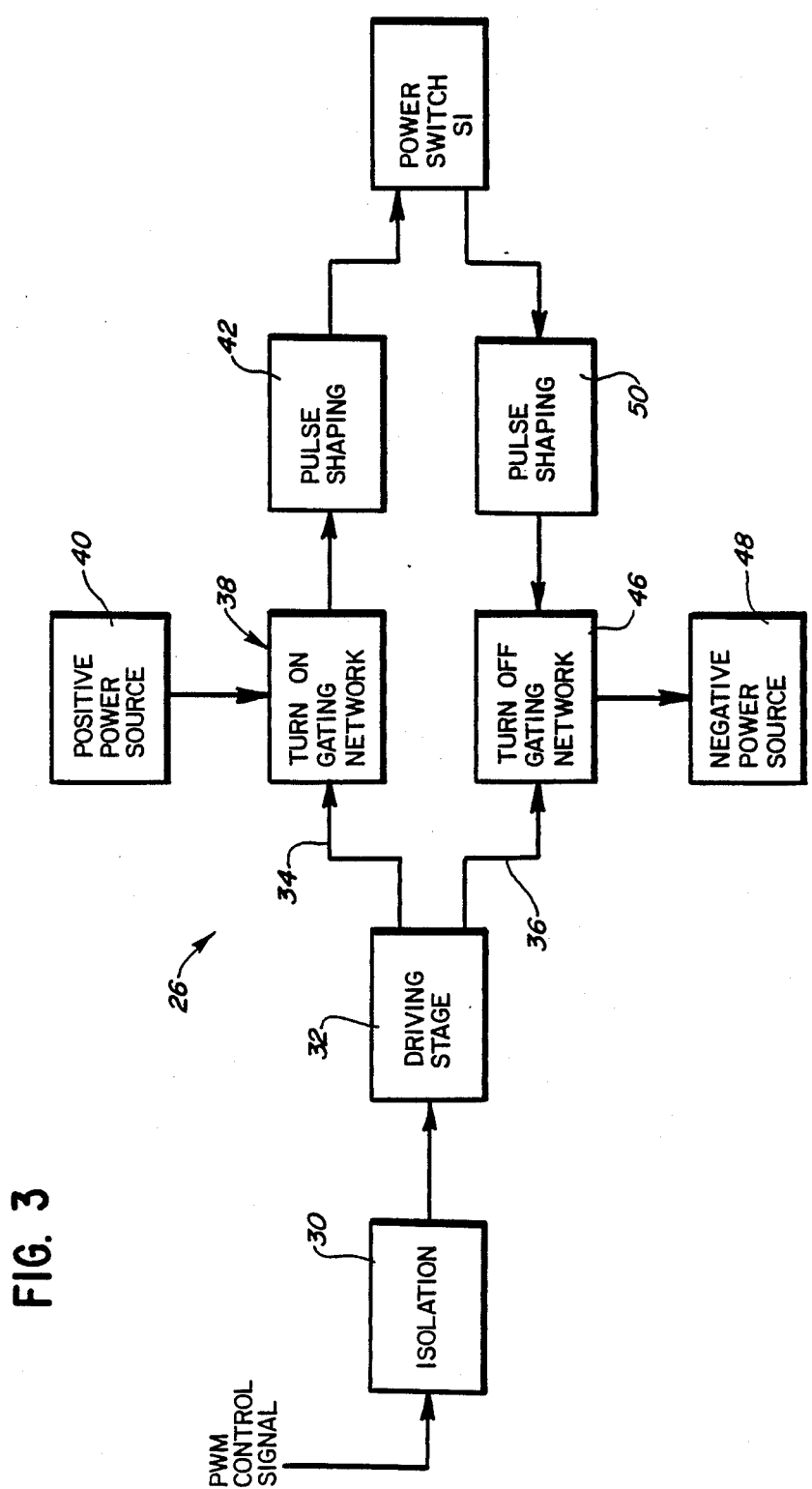
FIG. 3 is a block diagram of circuitry for operating one of the switches S1-S6 shown in FIG. 2.

Referring now to FIG. 3, there is illustrated a portion of the switch control 24 shown in block diagram form in FIG. 2. The circuitry shown in FIG. 3 comprises a drive circuit 26 for operating the power switch S1. It should be noted that duplicate circuitry is provided in the switch control 24 to operate the switches S2-S6 and, if desired, the switches 22.

The circuitry shown in FIG. 3 receives a PWM control signal which is developed by a conventional PWM amplifier (not shown). The PWM control signal is isolated by an isolation circuit 30 and is coupled to a driving stage 32 that develops gating signals on a pair of lines 34,36 from the isolated PWM control signal. The line 34 is in turn coupled to a turn-on gating network 38 which is coupled to a first power source 40. The first power source develops voltage of a first or positive polarity which is selectively coupled by the turn-on network 38 and pulse shaping circuitry 42 to the power switch S1 so that forward base drive is applied thereto. This selective application of power to the power switch S1 turns the switch on to couple the DC voltage on the power bus 14a, FIG. 2, to the phase output 20A.

The line 36 from the driving stage 32 is coupled to a turn-off gating network 46 which is separate from the turn-on gating network 38. The turn-off network 46 is in turn coupled to a second power source 48 which develops voltage of a second polarity opposite the first polarity. This second polarity voltage is selectively applied by the turn-off network 46 and pulse shaping circuitry 50 to the power switch S1 so that reverse base drive is applied thereto to turn same off.

It should be noted that the first and second power sources 40,48 may in fact comprise the outputs of the rectifier circuit 12 on the buses 14a,14b, or may comprise a rectified output of a permanent magnet generator or other power source, as desired.

Figure 4:
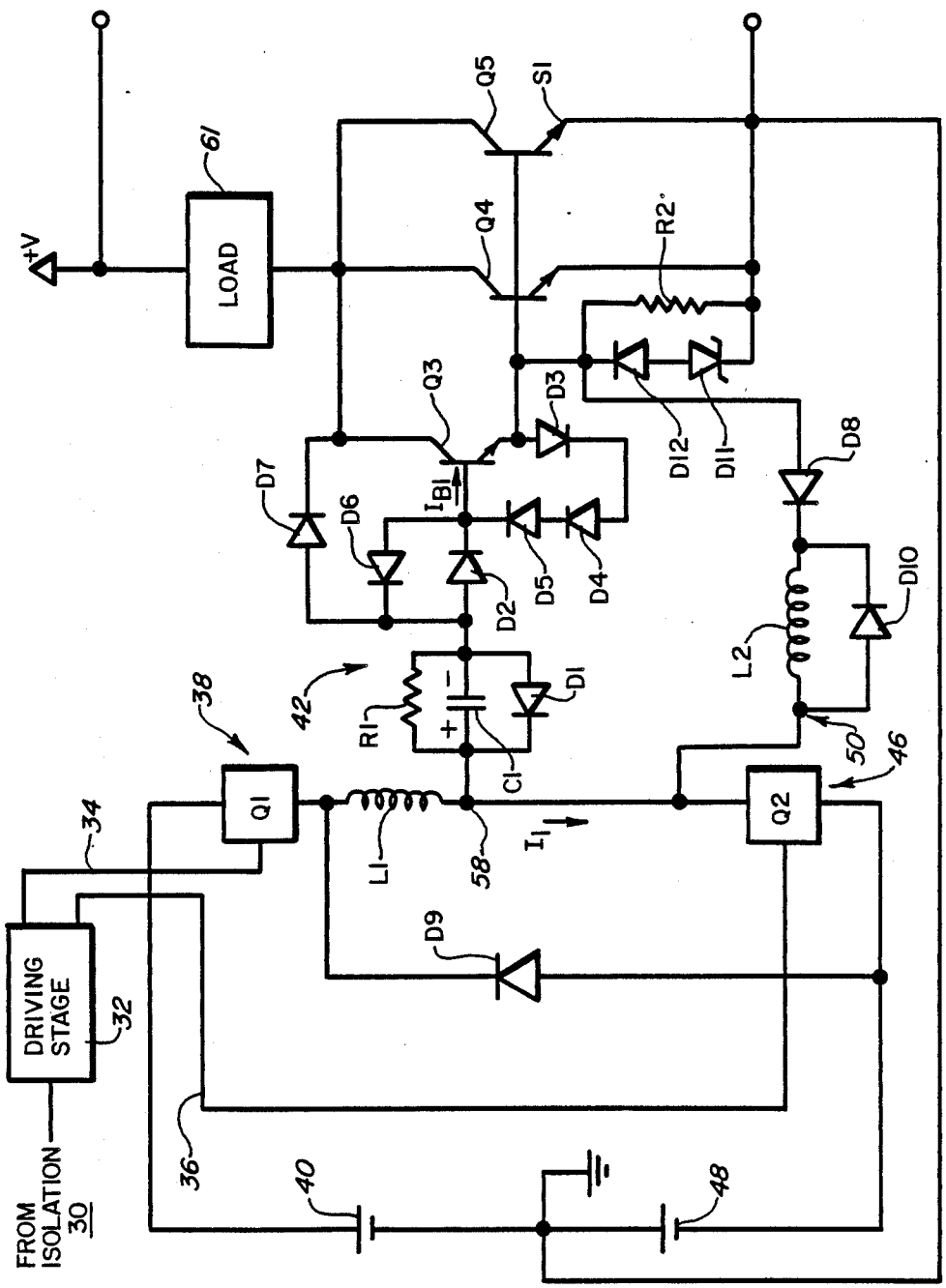
FIG. 4 is a more specific combined schematic and block diagram of a portion of the circuitry shown in FIG. 3.

Referring now to FIG. 4, there is illustrated in greater detail the turn-on and turn-off gating networks 38,46, the pulse shaping circuitry 42,50 and the power switch S1.

The gating signals from the driving stage 32 on the lines 34, 36 determine the on/off status of the power switch S1.

The line 34 is coupled to a control electrode of a first controllable switch Q1 which is a part of the turn-on gating network 38. Main current electrodes of the switch Q1 are coupled between the positive power source 40 and a first inductor L1. The inductor L1 is coupled by a second controllable switch Q2, which is a part of the turn off gating network 46, to the negative power source 48. A junction 58 between the inductor L1 and the controllable switch Q2 is coupled by a parallel combination of a capacitor C1, a diode D1 and a resistor R1 through a diode D2 to the control or base electrode of a driver transistor Q3 forming a part of the power switch S1. The switch S1 further includes driven transistors Q4, Q5 each having a control or base electrode and main current path (i.e. collector and emitter) electrodes.

The collector electrodes of the transistors Q3–Q5 are coupled together to a load 61 which is in turn coupled to a voltage V+.

It should be noted that the two transistors Q4 and Q5 may be replaced by a single driven transistor or three or more parallel transistors, if desired.

Three series-connected diodes D3–D5 are coupled between the bases of the transistors Q4 and Q5 and the base of the transistor Q3. Additional diodes D6 and D7 are coupled between the base of the transistor Q3 and the collector thereof. In addition, the cathode of the diode D6 is connected to the anode of the diode D2.

A diode D8 and a second inductor L2 are coupled between the base of the transistor Q4 and the junction 58. Diodes D9 and D10 are coupled to the inductors L1 and L2 to provide a path for reactive currents developed thereby.

A series combination of a zener diode D11 and a further diode D12 is coupled between the base of the transistor Q4 and the emitters of the transistors Q4 and Q5. A resistor R2 is coupled in parallel with the series combination of the diodes D11 and D12.

It should be noted that, in the preferred embodiment, the controllable switches Q1 and Q2 comprise power FET's, although they may be a different type of power switch, if desired.

Figure 5:
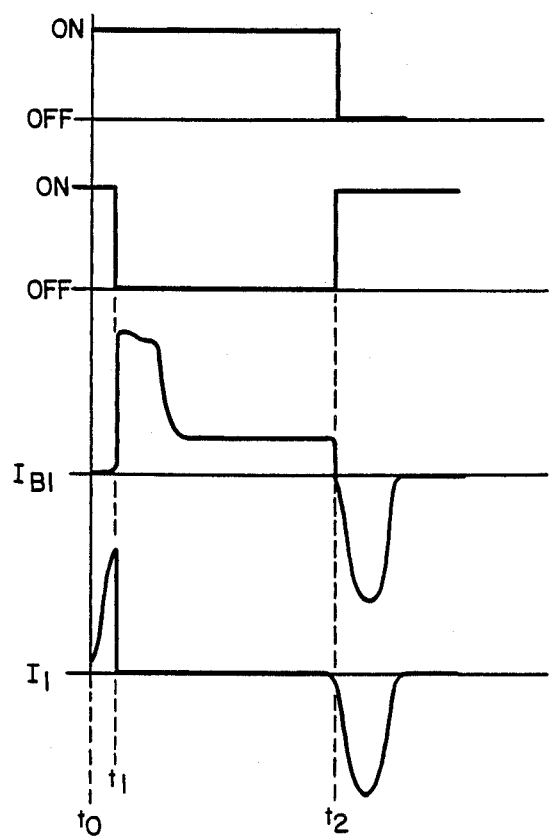
FIG. 5 is a set of waveform diagrams illustrating the operation of the circuitry shown in FIG. 4.

The operation of the circuitry illustrated in FIG. 4 will now be described with reference to the waveforms in FIG. 5. Assume that immediately prior to time T = t0 the switch Q2 is on or closed while the switch Q1 is off or opened so that the power switch S1 is off. At the beginning of a turn on sequence at the time T = t0 the driving stage 32 develops a high state signal on the line 34 to turn on or close the switch Q1 so that a current path is established from the power source 40 through the switch Q1, the inductor L1 and the switch Q2 to the power source 48. As seen in the waveform illustrating the current $I_1$, the current through the inductor L1 rises rapidly until the switch Q2 is turned off by a low state signal on the line 36 at a time t1. The current which was flowing through the switch Q2 is then diverted through the pulse shaping circuitry 42 to the base of the transistor Q3, as illustrated by the waveform diagram illustrating Q3 base current $I_{B1}$ subsequent to the time t1. The inductor current decays from the current magnitude flowing therethrough immediately prior to turn off of the switch Q2 to a constant value for the balance of the time that the switch Q1 is on. During this time, the capacitor C1 charges to a voltage determined by the current flowing through the resistor R1 wherein the polarity of the voltage is indicated by the polarity markings of FIG. 4.

At a time t2, which comprises the beginning of a turn off sequence, the driving stage 32 develops gating signals on the lines 34, 36 to turn off the transistor Q1 and turn on the transistor Q2. The prior charging of the capacitor C1 results in an augmented voltage of the second polarity greater than the voltage developed by the second voltage source 48 to be applied across the base-emitter junction of the transistor Q3. Control electrode current is thus drawn from the transistor Q3 through the diode D6, the parallel combination of elements R1, C1 and D1 and the transistor Q2 to the second voltage source 48. The transistor Q3 thus begins to immediately turn off. At the time t2, however, the inductor L2 resists current flow out of the control electrodes of the transistors Q4 and Q5. In effect, a delay period of predetermined extent determined by the inductance of the inductor L2 is interposed between turning on of the switch Q2 and the drawing of control electrode currents from the transistors Q4 and Q5 so that recombination of excess minority carriers in the control (i.e. base-emitter) junctions of these transistors can occur. In practice, the delay period is selected to be long enough to allow recombination of sufficient minority carriers to minimize the incidence of localized "hot spots", but not so long as to adversely affect the switching rate of the transistors Q4 and Q5.

Following expiration of the delay period after the beginning of the turn off sequence, base current flows out of the transistors Q4 and Q5 to turn off same.

Figure 6:
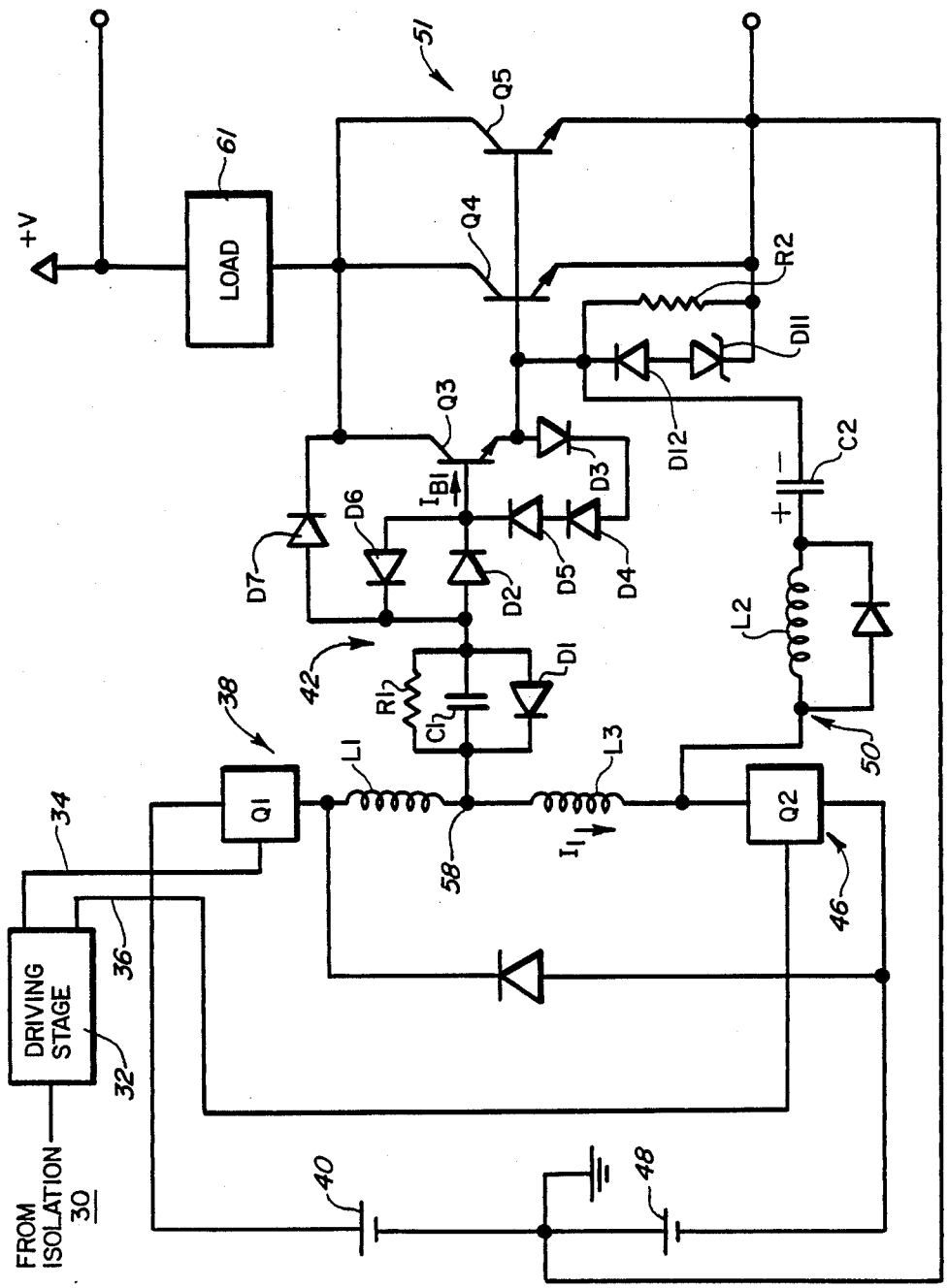
FIG. 6 is a combined block and schematic diagram similar to FIG. 4 illustrating alternative embodiments of the invention.

It should be noted that the diode D8 is poled in such a way to prevent current flow into the bases of the transistors Q4 and Q5 from the inductors L1 and L2. The diode D8 may be replaced, as seen in FIG. 6, with a second capacitor C2, if desired, which is charged during the time that the transistors Q3–Q5 are on to a potential and polarity as indicated by the polarity markings of FIG. 6. Subsequently, at the beginning of the turn off sequence, an augmented voltage of the second polarity greater than the voltage developed by the source 48 is provided to the bases of the transistors Q4 and Q5. Once the inductor L2 permits significant current flow, these transistors will be rapidly turned off by the augmented voltage.

As also seen in FIG. 6, a further inductor L3 may be coupled between the junction 58 and the switch Q2. This inductor serves a similar purpose for the transistor Q3 as the inductor L2 serves for the transistors Q4 and Q5, i.e. to provide a delay period following the beginning of the turn off sequence before which significant base current is drawn from the transistor Q3. Again, this delay period allows excess minority carriers to recombine so that the incidence of "hot spots" is minimized.

We claim:

1. A drive circuit for rapidly switching driver and driven transistors each having a control electrode and a pair of main current electrodes and connected in a Darlington configuration whereby the control electrode of the driven transistor is coupled to one of the main current electrodes of the driver transistor and the other of the main current electrodes of the driver transistor is coupled to one of the main current electrodes of the driven transistor, comprising:

a first controllable switch coupled to the control electrode of the driver transistor and operable to selectively apply a first polarity voltage to the driver and driven transistors to turn on same;

an inductor coupled to the first controllable switch and the control electrode of the drier transistor;

a second controllable switch coupled to the control electrode of one of the driver and driven transistors and operable to selectively apply a second polarity voltage to the one transistor to turn off the driver and driven transistors;

means for controlling the controllable switches and operative at the beginning of a turn on sequence to close the controllable switches and thereby establish current flow through the inductor and operative following the beginning of the turn on sequence for opening the second controllable switch while maintaining the first switch closed so that the current flow through the inductor is provided to the driver transistor to turn on same.

2. The drive circuit of claim 1, wherein the controlling means includes means for opening the first controllable switch and closing the second controllable switch at the beginning of a turn off sequence so that control electrode currents are drawn from the transistors to turn off same.

3. The drive circuit of claim 2, further including a second inductor coupled between the control electrode of the driven transistor and the second controllable switch wherein the second inductor delays the drawing of control electrode currents from the driven transistor.

4. The drive circuit of claim 3, further including a third inductor coupled between the control electrode of the driver transistor and the second controllable switch wherein the third inductor delays the drawing of control electrode currents from the driver transistor.

5. The drive circuit of claim 2, further including a voltage source coupled to the second controllable switch which develops a particular voltage magnitude of the second polarity and a capacitor coupled between the control electrode of the driver transistor and a junction between the second controllable switch and the first inductor whereby the capacitor is charged when control electrode current is provided to the driver transistor so that a voltage magnitude of the second polarity greater than the particular voltage magnitude is subsequently provided to the control electrode of the driver transistor after the beginning of the turn off sequence.

6. The drive circuit of claim 3, further including a diode coupled between and poled to conduct current from the control electrode of the driven transistor to the second inductor.

7. The drive circuit of claim 3, further including a voltage source coupled to the second controllable switch which develops a particular voltage magnitude of the second polarity and a capacitor coupled between the control electrode of the driven transistor and the second inductor whereby the capacitor is charged when control electrode current is provided to the driven transistor so that a voltage magnitude of the second polarity greater than the particular voltage magnitude is subsequently provided to the control electrode of the driven transistor after the beginning of the turn off sequence.

8. A drive circuit for rapidly switching driver and driven transistors each having a control electrode and a pair of main current electrodes and connected in a Darlington configuration whereby the control electrode of the driven transistor is coupled to one of the main current electrodes of the driver transistor and the other of the main current electrodes of the driver transistor is coupled to one of the main current electrodes of the driven transistor, comprising:

a first power source developing a voltage of a first polarity;

a first controllable switch coupled to the first power source;

a first inductor coupled to the first controllable switch;

a capacitor coupled between the first inductor and the control electrode of the driver transistor;

a second power source developing a voltage of a second polarity;

a second controllable switch coupled between the second power source and a junction between the capacitor and the first inductor;

a second inductor coupled between the control electrode of the driven transistor and the second controllable switch; and means for controlling the controllable switches and operative at the beginning of a turn on sequence to close both controllable switches and thereby establish current flow through the first inductor and operative following the beginning of the turn on sequence for opening the second controllable switch while maintaining the first switch closed so that the current flow through the inductor is provided to the control electrodes of the driver and driven transistors to turn on such transistors whereby the capacitor is charged during such time and operative at the beginning of a turn off sequence to open the first controllable switch and to close the second controllable switch whereby the charging of the capacitor and the closing of the second controllable switch causes a voltage of the second polarity greater than the voltage developed by the second power source to be delivered to the control electrode of the driver transistor so that currents are drawn therefrom and whereby currents are drawn from the control electrode of the driven transistor after a delay period following the beginning of the turn off sequence, the length of such delay period being determined by the inductance of the second inductor.

9. The drive circuit of claim 8, further including a diode coupled between and poled to conduct current from the control electrode of the driven transistor to the second inductor.

10. The drive circuit of claim 8, further including a second capacitor coupled between the control electrode of the driven transistor and the second inductor whereby the capacitor is charged when current is provided to the control electrode of the driven transistor so that a voltage of the second polarity greater than the voltage developed by the second power source is subsequently provided to the control electrode of the driven transistor after the beginning of the turn off sequence 11. The drive circuit of claim 8, further including a third inductor coupled between the control electrode of the driver transistor and the second controllable switch wherein the third inductor prevents the drawing of control electrode currents from the driver transistor until after the end of a second delay period following the beginning of the turn off sequence, the length of the second delay period being determined by the inductance of the third inductor.

* * * * *